United States Patent
Cox et al.

(10) Patent No.: US 10,236,201 B2
(45) Date of Patent: Mar. 19, 2019

(54) WAFER CARRIER FOR SMALLER WAFERS AND WAFER PIECES

(71) Applicant: Applied Materials, Inc., Santa Clara, CA (US)

(72) Inventors: Michael S. Cox, Gilroy, CA (US); Cheryl A. Knepfler, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 330 days.

(21) Appl. No.: 15/249,009

(22) Filed: Aug. 26, 2016

(65) Prior Publication Data

US 2016/0365269 A1  Dec. 15, 2016

Related U.S. Application Data

(62) Division of application No. 14/099,856, filed on Dec. 6, 2013, now Pat. No. 9,460,950.

(51) Int. Cl.
*H01L 21/683* (2006.01)
*H01L 21/677* (2006.01)

(52) U.S. Cl.
CPC .... *H01L 21/6833* (2013.01); *H01L 21/67748* (2013.01); *H01L 21/6838* (2013.01); *Y10T 29/49998* (2015.01)

(58) Field of Classification Search
CPC ............. H01L 21/6833; H01L 21/6838; H01L 21/67748; Y10T 29/49998
See application file for complete search history.

(56) References Cited

U.S. PATENT DOCUMENTS 5,229,910 A  *  7/1993  Kasahara .................. G09F 7/12
                                                            296/21
5,751,538 A     5/1998  Nakasuji
(Continued)

FOREIGN PATENT DOCUMENTS

JP      S619655 A      1/1986
JP      H0216749 A     1/1990
(Continued)

OTHER PUBLICATIONS

International Search Report and Written Opinion for International Application No. PCT/US2014/056607.
(Continued)

*Primary Examiner* — Sarang Afzali
*Assistant Examiner* — Ruth G Hidalgo-Hernandez
(74) *Attorney, Agent, or Firm* — Patterson + Sheridan, LLP

(57) ABSTRACT

Embodiments described herein relate to an apparatus and method for securing and transferring substrates. A substrate carrier, having one or more electrostatic chucking electrodes disposed therein, electrostatically couples a substrate to the carrier. Optionally, a mask may also be electrostatically coupled to the carrier and may be disposed over a region of the carrier not occupied by the substrate. In one embodiment, multiple electrode assemblies are provided such that a first electrode assembly chucks the substrate to the carrier and a second electrode assembly chucks the mask to the carrier. In another embodiment, a pocket is formed in the carrier and an electrode assembly provides chucking capability within the pocket.

17 Claims, 5 Drawing Sheets

(56) References Cited

U.S. PATENT DOCUMENTS

| | | | |
|---|---|---|---|
| 5,789,843 A | 8/1998 | Higuchi et al. | |
| 5,886,866 A | 3/1999 | Hausmann | |
| 6,433,346 B1 | 8/2002 | Hirayanagi | |
| 6,487,063 B1 | 11/2002 | Nakasuji | |
| 6,678,143 B2 | 1/2004 | Masuda et al. | |
| 6,768,627 B1 | 7/2004 | Kitabayashi et al. | |
| 6,781,812 B2 | 8/2004 | Fuwa et al. | |
| 7,804,675 B2 | 9/2010 | Poh | |
| 7,881,036 B2 | 2/2011 | Fujisawa et al. | |
| 7,916,447 B2 | 3/2011 | Kobayashi et al. | |
| 8,125,756 B2 | 2/2012 | Poh | |
| 8,238,072 B2 | 8/2012 | Fujisawa et al. | |
| 8,325,457 B2 | 12/2012 | Park et al. | |
| 8,335,070 B2 | 12/2012 | Poh | |
| 8,503,156 B2 | 8/2013 | Ray et al. | |
| 8,730,644 B2 | 5/2014 | Fujisawa et al. | |
| 9,287,806 B2 | 3/2016 | Park | |
| 2007/0002516 A1 | 1/2007 | Matsumoto | |
| 2008/0062609 A1 | 3/2008 | Himori et al. | |
| 2012/0227886 A1 | 9/2012 | Hsiao et al. | |
| 2015/0043123 A1 | 2/2015 | Cox | |
| 2015/0331337 A1 | 11/2015 | Sundarrajan et al. | |
| 2016/0064267 A1 | 3/2016 | Toh et al. | |

FOREIGN PATENT DOCUMENTS

| | | |
|---|---|---|
| JP | H04237148 A | 8/1992 |
| JP | 2000294902 | 10/2000 |
| JP | 2000294902 A | 10/2000 |
| JP | 2002-357838 A | 12/2002 |
| JP | 2003-179128 A | 6/2003 |
| JP | 2003-243493 A | 8/2003 |
| JP | 2004-200620 A | 7/2004 |
| JP | 2005285825 | 10/2005 |
| JP | 2005285825 A | 10/2005 |
| JP | 2010-165805 A | 7/2010 |
| JP | 2010219253 A | 9/2010 |
| JP | 2011097044 | 5/2011 |
| JP | 2012-248741 A | 12/2012 |
| KR | 1020090015378 | 2/2009 |
| KR | 20110099974 A | 9/2011 |
| KR | 20130089565 A | 8/2013 |

OTHER PUBLICATIONS

Chinese Office Action and Search Report dated Jun. 1, 2018 for Application No. 201480065526.6.

Japanese Office Action dated Jul. 30, 2018 for Application No. 2016-536811.

Office Action for U.S. Appl. No. 14/099,856 dated Feb. 26, 2016.

Search Report for Taiwan Application No. 106112325 dated Oct. 23, 2017.

\* cited by examiner

WAFER CARRIER FOR SMALLER WAFERS AND WAFER PIECES

CROSS-REFERENCE TO RELATED APPLICATIONS

This application is a divisional of and claims benefit to U.S. patent application Ser. No. 14/099,856, filed Dec. 6, 2013, the entirety of which is herein incorporated by reference.

BACKGROUND OF THE INVENTION

Field of the Invention

Embodiments described herein generally relate to a substrate carrier having an electrostatic chuck disposed therein configured for transporting and securing substrates. More specifically, embodiments described herein relate to a wafer carrier for smaller wafers and wafer pieces.

Description of the Related Art

Semiconductor processing equipment is generally engineered for performing processes on a single size substrate. A robot blade repeatedly transfers a carrier with a substrate disposed thereon into and out of a processing chamber. The carrier and robot blade are specifically sized to accommodate a single size substrate to improve substrate transferring characteristics and prevent damage to the substrates during transfer and positioning within the chamber. However, certain technologies that have been developed at larger substrate sizes do not exist at smaller substrate sizes. Additionally, increasingly thinner substrates having thicknesses as low as 100 μm are being utilized in microelectronics manufacturing. Thus, it may be difficult to perform certain processes on small or thin substrates because processing equipment is not available and engineered to accommodate a small or thin substrate. In addition, processing pieces or portions of a substrate may be advantageous during product development or process tuning, however, current transfer equipment and techniques are generally unable to adequately transfer substrate pieces.

Therefore, there is a need in the art for an improved substrate carrier for transferring substrates of various sizes and thicknesses.

SUMMARY

Embodiments described herein relate to an apparatus and method for supporting substrates. The apparatus may be in the form of a substrate carrier, having one or more electrostatic chucking electrodes disposed therein. The substrate carrier is configured to electrostatically couple a substrate to the carrier. Optionally, the substrate carrier may be configured to electrostatically couple a mask to the carrier that is disposed over a region of the carrier not occupied by the substrate. In one embodiment, multiple electrode assemblies are provided such that a first electrode assembly chucks the substrate to the carrier and a second electrode assembly chucks the mask to the carrier. In another embodiment, a substrate receiving pocket is formed in the carrier and an electrode assembly provides chucking capability within the pocket.

In one embodiment, a method of supporting a substrate is provided. The method comprises positioning a substrate on a carrier. The carrier has an electrostatic chucking electrode disposed within a body of the carrier. The body has a top surface that is configured to support the substrate. A mask is positioned over the top surface of the carrier, circumscribing the substrate. The electrostatic chucking electrode is energized and the substrate and mask are electrostatically chucked to the carrier.

In another embodiment, a method for supporting a substrate is provided. The method comprises positioning a substrate on a carrier. The carrier has a first electrostatic chucking electrode and a second electrostatic chucking electrode disposed within a body of the carrier. A top surface of the carrier is configured to support the substrate. The first electrostatic chucking electrode is energized to secure the substrate to the carrier. A mask is positioned over the top surface of the carrier around the substrate. The second electrostatic chucking electrode is energized to secure the mask to the carrier.

In yet another embodiment, an apparatus for supporting a substrate is provided. The apparatus comprises a carrier having a body and a top surface configured to support a substrate. One or more electrostatic chucking electrodes are disposed within the carrier body. A mask is also provided. The mask is configured to surround and expose one or more selected regions of the top surface of the carrier. The mask is capable of electrostatically coupled to the top surface of the carrier by application of power to the one or more electrostatic chucking electrodes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a carrier for transporting small substrates or pieces of a substrate. The carrier has one or more electrode assemblies disposed therein which enable to carrier to selectively electrostatically chuck different regions of the carrier. A mask may be disposed over a desired region of the carrier to expose a substrate electrostatically chucked to the carrier. In certain embodiments, a first electrode assembly enables chucking of a first region of the carrier and a second electrode assembly enables chucking of a second region of the carrier. For example, the first electrode assembly may chuck a substrate to the first region and the second electrode assembly may chuck a mask to the second region. In another embodiment, a recessed pocket if formed in the carrier and an electrode assembly is configured to provide chucking capability within the pocket.

Figure 1:
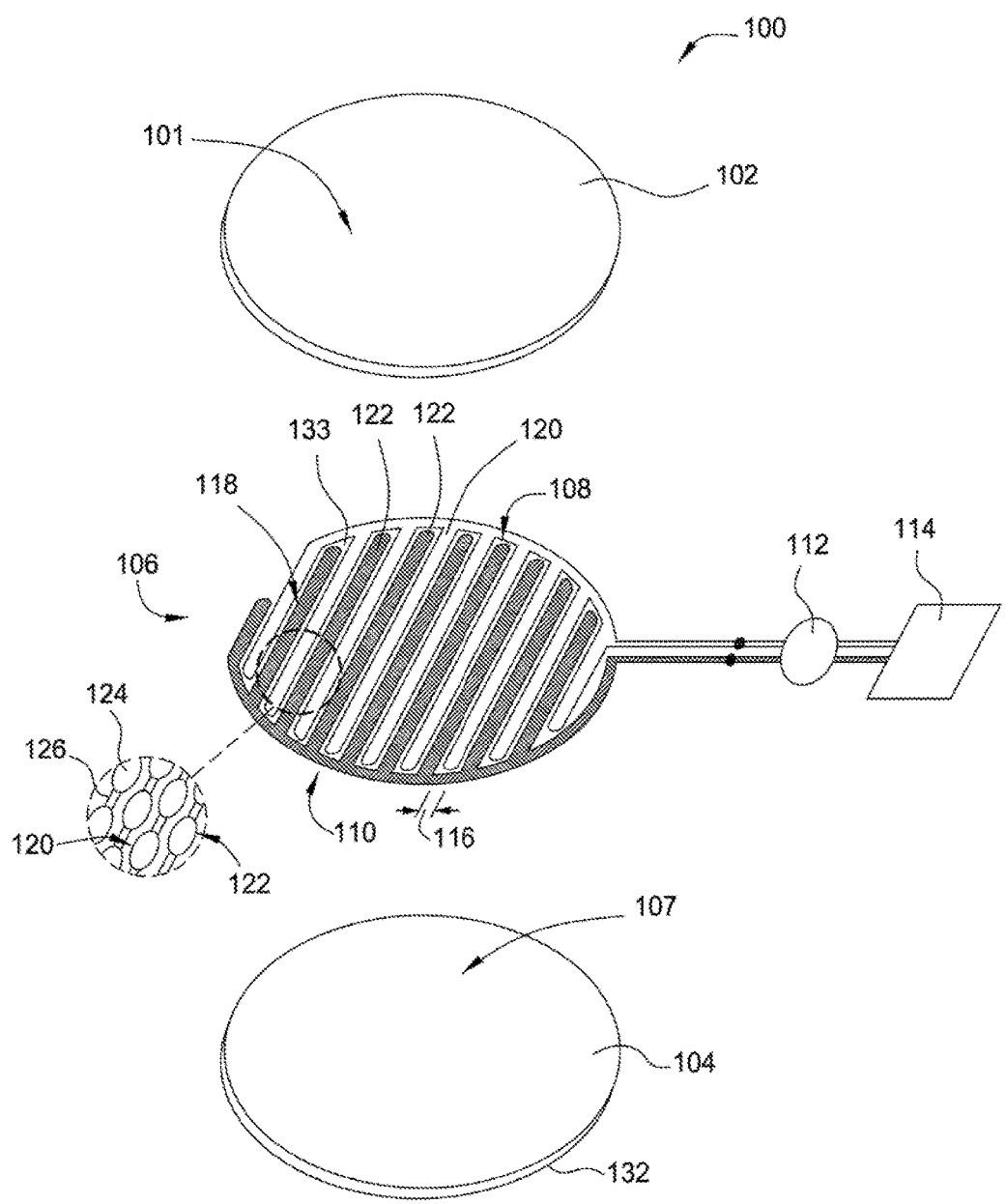
FIG. 1 illustrates an exploded view of an electrostatic chuck according to one embodiment disclosed herein.

FIG. 1 depicts an exploded view of an electrostatic chuck 100. The electrostatic chuck 100 may be used in any suitable plasma process, including physical vapor deposition (PVD) process, chemical vapor deposition (CVD) process, etching process, or any suitable plasma or vacuum process. The electrostatic chuck 100 may also be adapted for use in non-plasma and non-vacuum environments and may be compatible for high temperature applications. Although various embodiments of an electrostatic chuck 100 are disclosed herein, it is contemplated that electrostatic chucks from any manufacturer may be adapted to benefit from the invention.

The electrostatic chuck 100 includes an insulating base 104, an electrode assembly 106 disposed on a top surface 107 of the insulating base 104, and an encapsulating member 102 disposed on the electrode assembly 106. The insulating base 104 may have any suitable shape selected for handling a specific substrate. In the example depicted in FIG. 1, the insulating base 104 has circular shape having a periphery 132 that substantially matches the shape and size of electrode assembly 106. The encapsulating member 102 is formed over the electrode assembly 106 to allow a substrate with similar shape and size to be disposed on a top surface 101 of the encapsulating member 102. It is noted that the insulating base 104 may be in any shape or configuration as needed. Additionally, the electrode assembly 106 may comprise one or more electrode assemblies and the electrode assemblies may be in any shape or configuration to accommodate various shapes and sizes of substrates.

The insulating base 104 is fabricated from an insulating material, such as a dielectric material or a ceramic material. Suitable examples of ceramic materials or dielectric materials may include silicon oxide, such as quartz or glass, aluminum oxide ($Al_2O_3$), aluminum nitride (AlN), yttrium containing materials, yttrium oxide ($Y_2O_3$), yttrium-aluminum-garnet (YAG), titanium oxide (TiO), titanium nitride (TiN), silicon carbide (SiC) and the like. A doped ceramic, such as titania doped alumina or calcium doped aluminum nitride or the like may also be used. Optionally, the insulating base 104 may be a metallic or semiconducting body having a dielectric layer disposed on the surface 107 facing the electrode assembly 106.

The electrode assembly 106 disposed on the insulating base 104 includes at least two sets of distributed electrodes 108, 110. Each electrode 108, 110 is charged with different polarities as needed when a voltage power is applied thereto, thus generating an electrostatic force. The electrodes 108, 110 may be configured to distribute the electrostatic force across the surface of the encapsulating member 102. Each electrode 108, 110 may each have a plurality of electrode fingers 120, 122 intervening with each other. It is believed that electrode interleaved fingers 120, 122 provide local electrostatic attraction distributed across a large area of the electrostatic chuck 100 in which the aggregation provides a high chucking force while utilizing less chucking voltage.

The electrode fingers 120, 122 may be formed to have different lengths and geometry. In one example, one or both of the electrode fingers 120, 122 may be formed from interconnected electrode islands 124. Interconnections 126 between electrode islands 124 may be in the plane of the electrodes 108, 110 as shown in FIG. 1, or out of plane, such as in the form of jumpers and/or vias. In one embodiment, the electrode finger 120, 122 may have a width 116 of between about 0.1 mm and about 20 mm, for example about 0.25 mm to about 10 mm, which may vary depending upon the type of the insulating base 104 and the material type to be chucked. If desired, electrode fingers 120, 122 may be configured with different sizes intervening to each other. The electrode fingers 120, 122 may be alternatively and repeatedly formed until desired numbers of the electrode fingers 120, 122 are formed.

Between each of the electrode fingers 120 of the first electrode 108, spaces 133 are defined to receive electrode fingers 122 of the second electrode 110. The spaces 133 may be an air gap, filled with a dielectric spacer material, or filled with at least one of the insulating base 104 or encapsulating member 102.

It is contemplated that the configuration of the electrodes 108, 110 shown in FIG. 1 is solely for illustrative purposes. The electrodes 108, 110 may be arranged in any desired configuration such that the electrodes 108 are distributed over the top surface 107 of the insulating base 104 with alternating polarity. The concept of having two different sets of electrodes charged with different polarities can be equally well adapted to electrodes arranged in any desired configuration.

A power source 114 is coupled to the first and the second electrodes 108, 110 through a power switch 112. The power source 114 is configured to provide a voltage power to the first and the second electrode 108, 110 to generate charges with different polarities, either positive or negative charges. The positive or negative charges generated from the first and the second electrode 108, 110 provide an electrostatic force to attract a substrate disposed in the electrostatic chuck 100 in a secured position. In one embodiment, the power source 114 may be configured to provide a DC or AC power to the first and the second electrodes 108, 110. In another embodiment, the power source 114 may be configured to provide RF power which capacitively couples to the electrodes 108, 110 to apply an RF bias to the substrate.

The encapsulating member 102 is disposed on the insulating base 104, sandwiching the electrode assembly 106, to form an electrostatic chuck 100 as a unitary structure. The encapsulating member 102 is positioned on the electrode assembly 106 to provide an insulating surface on which the substrate is chucked. The encapsulating member 102 may be fabricated by a material having thermal properties, e.g., a coefficient of thermal expansion, substantially matching that of the underlying electrode assembly 106, and in some embodiments, also the insulating base 104.

After the encapsulating member 102, the electrode assembly 106 and the insulating base 104 are stacked in a predetermined order. Then, a bonding process, such as an annealing process, is performed to fuse the encapsulating member 102, the electrode assembly 106 and the insulating base 104 together, forming a laminated structure of the electrostatic chuck 100 as an integral part. As the encapsulating member 102, the electrode assembly 106 and the insulating base 104 may be required to operate in a high temperature environment, e.g., greater than 300 degrees Celsius, the materials utilized to fabricate these components may be selected from heat resistant materials, such as ceramic materials or glass materials, that can sustain high temperature thermal treatment.

In one embodiment, the encapsulating member 102 and the insulating base 104 may be fabricated from a ceramic material, a glass material, or a composite of ceramic and metal material, providing good strength and durability as well as heat transfer properties. The materials selected to fabricate the encapsulating member 102 and the insulating base 104 may have a coefficient of thermal expansion that is substantially matched or similar to the intermediate electrode assembly 106 to reduce thermal expansion mismatch, which may cause stress or failure under high thermal loads. The ceramic material suitable for fabricating the encapsulating member 102 and the insulating base 104 may include, but not limited to, glass, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). In another embodiment, the encapsulating member 102 and the insulating base 104 may be fabricated from a composite material includes a different composition of a ceramic and metal, such as metal having ceramic particles dispersed therein.

During operation, a negative charge may be applied to the first electrode 108 and a positive charge may be applied to the second electrode 110, or vise versa, to generate an electrostatic force when power is supplied to the power source 114. During chucking, the electrostatic force generated from the electrodes 108, 110 chucks and holds the substrate disposed thereon in a secured position. As the power supplied from the power source 114 is turned off, the charges present in the interface 118 between the electrodes 108, 110 may be maintained over an extended period of time. To release the substrate held on the electrostatic chuck 100, a short pulse of power in the opposite polarity may be provided to the electrodes 108, 110 to remove the charge present in the interface 118.

Figure 2A:
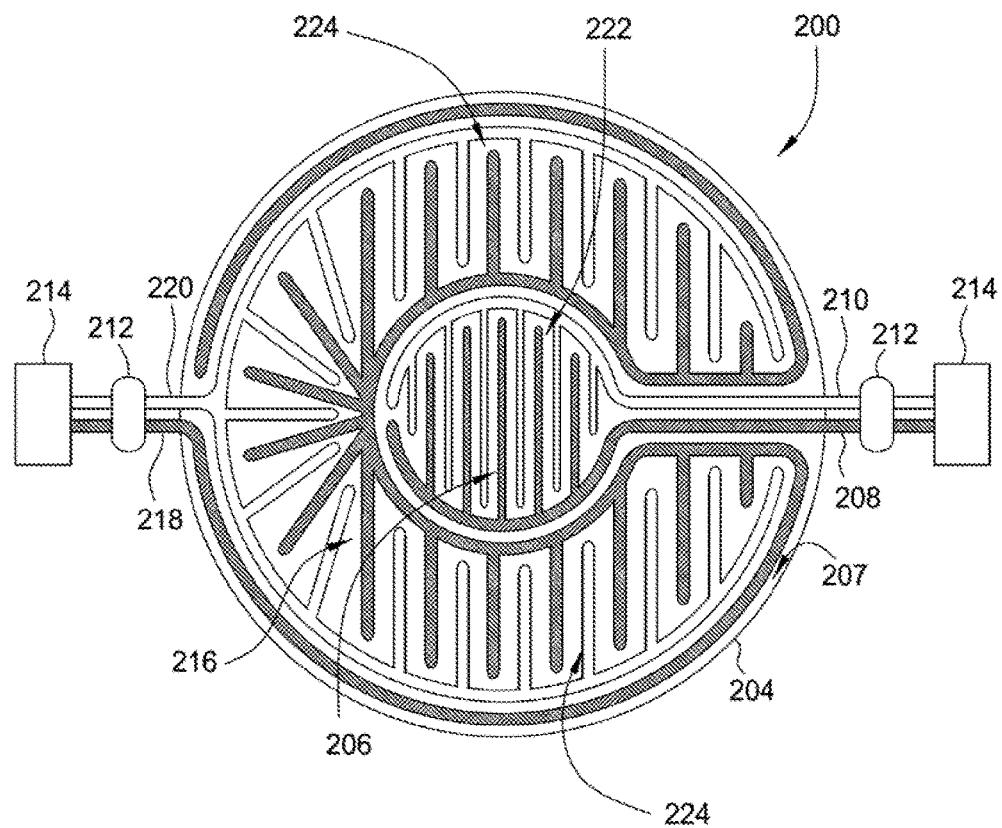
FIG. 2A illustrates a plan view of a carrier having electrode assemblies disposed thereon according to one embodiment disclosed herein.

FIG. 2A illustrates a plan view of a carrier 200 having electrode assemblies 206, 216 disposed thereon. An insulating base 204 is provided and a first electrode assembly 206 and a second electrode assembly 216 are formed on the insulating base 204. In the illustration of FIG. 2A, an encapsulating member has been removed to more clearly depict the electrode assemblies 206, 216. The electrode assemblies 206, 216 may be constructed similar to the electrode assembly 106 described with regard to FIG. 1.

The first electrode assembly 206 comprises a first electrode 208 and a second electrode 210. The electrodes 208, 210 may be coupled to a power source 214 via a power switch 212, and may be energized with opposite polarities. The first electrode assembly 206 is disposed within the carrier 200 and defines a chucking region 222. For example, the chucking region 222 is substantially circular and defines a center region of the carrier 200. The chucking region 222 is generally sized substantially the same as the area of a workpiece to be held on the carrier 200. In one embodiment, the carrier 200 may have a diameter of about 300 mm and the chucking region 222 may have a diameter of about 200 mm. However, it is contemplated that the chucking region 222 may define an area having substantially any shape or size at any location on the carrier 200.

The second electrode assembly 216 comprises a third electrode 218 and a fourth electrode 220. The electrodes 218, 220 may be coupled to a power source 214 via a power switch 212, and may be energized with opposite polarities. The power source 214 and power switch 212 may be the same power source and power switch utilized to energize the first electrode assembly 206 or they may be an additional power source and power switch so that each electrode assembly 206, 216 may be independently energized. The second electrode assembly 216 is disposed within the carrier 200 and defines a chucking region 224. The chucking region 224 is generally sized to accommodate a mask and is outside of the area which supports the workpiece, i.e., the chucking region 222. For example, the chucking region 224 is substantially ring-like and defines a region of the carrier 200 circumferentially outward of the chucking region 222. In one embodiment, the chucking region 224 defines a region of the carrier not defined by the chucking region 222. The second electrode assembly 216 may include a break or discontinuity in it ring-like shape that prevents undesirable cross-talk between the electrodes 208, 210 of the first electrode assembly 206 by providing a path free of the electrodes 218, 220 from the chucking region 222 to the edge of the carrier 200. Thus, the first electrode assembly 206 defines the chucking region 222 of the carrier 200 and the second electrode assembly 216 defines the chucking region 224 of the carrier 200.

Similar to the first electrode assembly 206, it is contemplated that the chucking region 224 may define an area having substantially any shape or size at any location on the carrier 200. In one embodiment, the chucking region 222 and the chucking region 224 occupy substantially the entire top surface 207 of the insulating base 204. However, it is contemplated that the first and second regions 222, 224, respectively, may occupy less than substantially all of the top surface 207.

Figure 2B:
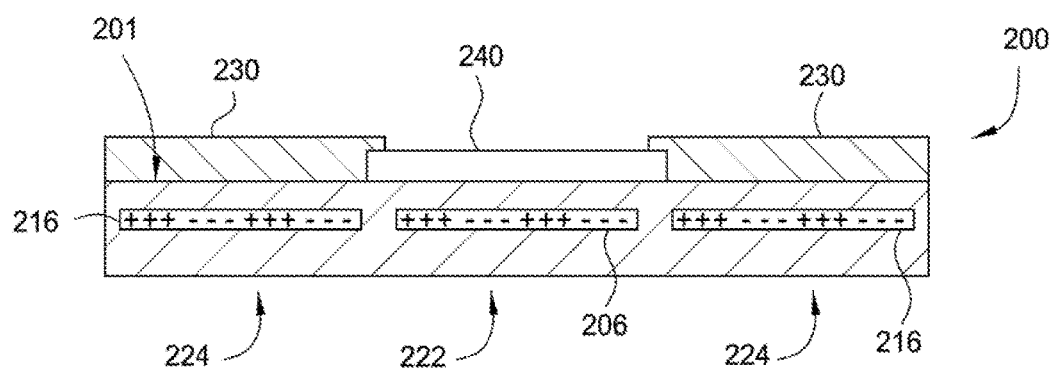
FIG. 2B illustrates a schematic, cross-sectional view of the carrier and electrode assembly of FIG. 2A according to one embodiment disclosed herein.

FIG. 2B illustrates a schematic, cross-sectional view of the carrier 200 and electrode assemblies 206, 216 of FIG. 2A. In addition, a substrate 240 and mask 230 are disposed on the carrier 200. Although not distinctly shown in FIG. 2B, the electrode assemblies 206, 216 are formed between the insulating base and the encapsulating member, the entirety of which comprises the carrier 200. The first electrode assembly 206 is configured to electrostatically chuck to the chucking region 222 of the carrier 200. In one embodiment, the first electrode assembly 206 defines the chucking region 222 and is sized to substantially match the size of the substrate 240 disposed on the carrier 200. Thus, the substrate 240 is disposed over the chucking region 222 of the carrier 200 and the substrate 240 is chucked to the carrier 200 by the first electrode assembly 206.

The second electrode assembly 216 is configured to electrostatically chuck the mask 230 to the chucking region 224 of the carrier 200. In one embodiment, the second electrode assembly 216 defines the chucking region 224 and is sized to substantially match the size of the mask 230 disposed on the carrier 200. Thus the mask 230 is disposed over the chucking region 224 of the carrier 200 and the mask 230 is chucked to the carrier 200 by the second electrode assembly 216.

Although the first electrode assembly 206 is shown as defining the chucking region 222 for chucking the substrate 240 and the second electrode assembly 216 is shown as defining the chucking region 224 for chucking the mask 230, it is contemplated that the first electrode assembly 206 defining the chucking region 222 may chuck a mask having a size corresponding to the chucking region 222 and the second electrode assembly 216 defining the chucking region 224 may chuck a substrate having a size corresponding to the chucking region 224. The embodiments shown are not intended to be limiting as it is contemplated that the electrode assemblies 206, 216 and corresponding regions 222, 224 may be formed in any desirable configuration to chuck a substrate and a mask of any desired size or configuration.

A top surface 201 of the carrier 200 is the top surface of the encapsulating member and is substantially planar. The top surface 201 is configured to support and electrostatically chuck the substrate 240 and mask 230 to the carrier 200. As illustrated, the substrate 240 is disposed on the top surface 201 of the carrier 200 corresponding to the chucking region 222 and the mask 230 is disposed on the top surface 201 of the carrier 200 corresponding to the chucking region 224. In one embodiment, at least a portion of the mask 230 extends over the substrate 240. The mask 230 may function to further secure the substrate 240 to the carrier 200 and prevent processing, such as deposition or etching, on portions of the substrate 240 covered by the mask 230. The mask 230 may have a diameter substantially similar to a diameter of the carrier 200 and cover substantially the entire surface area of the top surface 201 not occupied by the substrate 240. The mask 230 additionally functions to prevent deposition on or etching of the carrier 200, which may increase the effective lifetime of the carrier 200 and enable re-use of the carrier 200. The mask 230 may be manufactured from materials having similar thermal properties, i.e. coefficient of thermal expansion, as the substrate 240 to prevent damage to the substrate during processing at elevated temperatures.

Figure 3A:
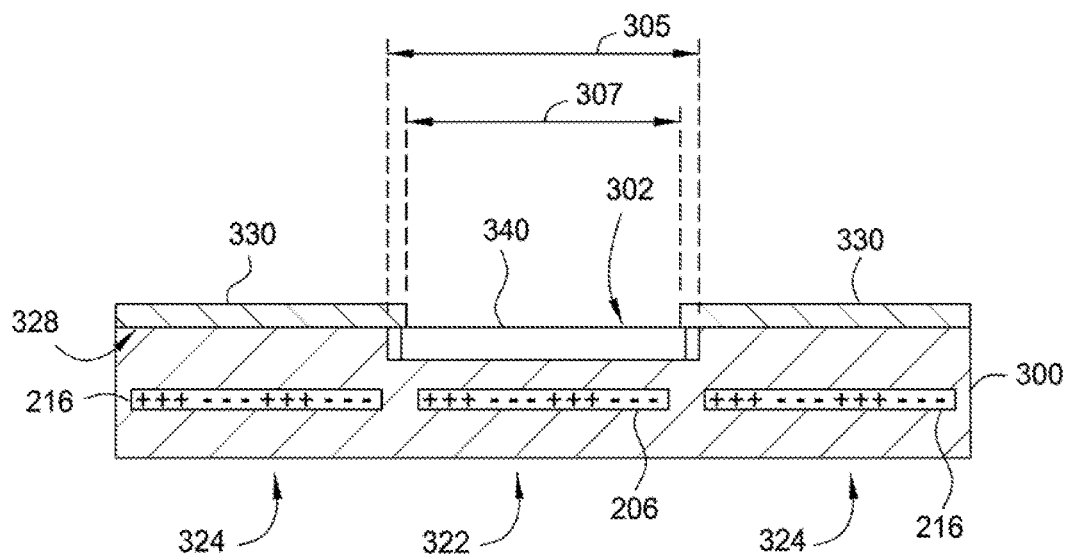
FIG. 3A illustrates a schematic, cross-sectional view of a carrier having a substrate and mask coupled thereto according to one embodiment disclosed herein.

FIG. 3A illustrates a schematic, cross-sectional view of a carrier 300 having a substrate 340 and mask 330 electrostatically coupled thereto. The first electrode assembly 206 defines a chucking region 322 and the second electrode assembly 216 defines a chucking region 324 of the carrier 300. Similar to embodiments previously described, the first and second regions 322, 324 correspond to areas of a top surface 328 of the carrier 300. In one embodiment, a recessed pocket 302 is formed in the carrier 300. The recessed pocket 302 is vertically aligned with the chucking region 322 and the first electrode assembly 206 so that the electrode assembly 206 may electrostatically chuck the substrate 340 to the bottom of the recessed pocket 302. Accordingly, the recessed pocket 302 is sized and configured to accommodate the substrate 340 within the recessed pocket 302. In one embodiment, the recessed pocket 302 may have a diameter slightly larger than the diameter of the substrate 340 disposed therein and a depth substantially equal to a thickness of the substrate 340.

The mask 330 is disposed on the top surface 328 of the carrier 300 over the chucking region 324 and is chucked to the carrier 300 by the second electrode assembly 216. A portion of the mask 330 may extend over a portion of the substrate 340 to prevent processing on edge regions of the substrate 340 and to further secure the substrate 340 within the recessed pocket 302. For example, a diameter 305 of the recessed pocket 302 may be greater than an inner diameter 307 of the mask 330. In this example, a portion of the mask 330 extends beyond the diameter 305 of the recessed pocket 302. The inner diameter 307 of the mask 330 may be less than a diameter of the substrate 340.

Figure 3B:
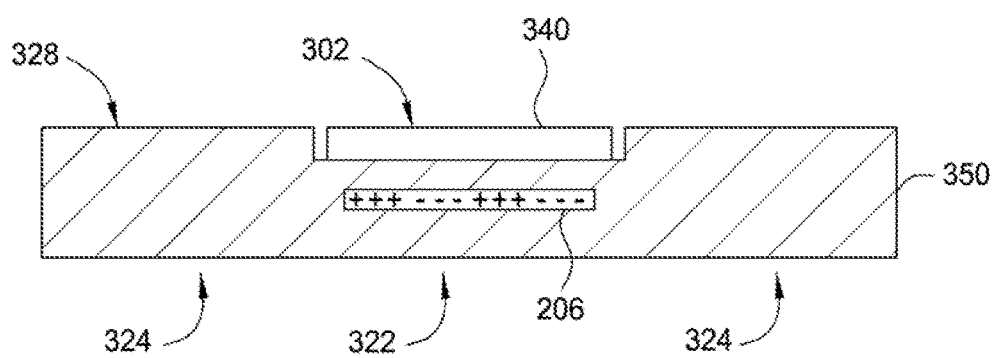
FIG. 3B illustrates a schematic, cross-sectional view of a carrier having a substrate coupled thereto according to one embodiment disclosed herein.

FIG. 3B illustrates a schematic, cross-sectional view of a carrier 350 having the substrate 340 electrostatically coupled thereto. The carrier 350 is similar to the carrier 300 described with regard to FIG. 3A, however, the second electrode assembly 216 is not present in the carrier 350. The first electrode assembly 206 defines a chucking region 322 and the chucking region 324 of the carrier 350 is disposed radially outward of the chucking region 322. The chucking region 322 corresponds to an area of the carrier 300 configured to chuck the substrate 340. The recessed pocket 302 is formed in the carrier 350 and corresponds to the chucking region 322. The first electrode assembly 206 is configured to provide electrostatic chucking within the recessed pocket 302. The recessed pocket 302 is sized and configured to accommodate the substrate 340 within the recessed pocket 302. In one embodiment, the recessed pocket 302 may have a diameter slightly larger than the diameter of the substrate 340 disposed therein and a depth substantially equal to a thickness of the substrate 340.

The top surface 328 corresponding to the chucking region 324 has no underlying chucking electrode. During processing, the substrate 340 is electrostatically chucked by the first electrode assembly 206 within the recessed pocket 302 while the top surface 328 is exposed to processing conditions within a processing chamber. The top surface 328 of the carrier 350 may be cleaned to remove any deposition build-up formed thereon during processing. During the cleaning, such as chemical mechanical polishing (CMP), bead blasting, etching, or other processes, the top surface 328 may be conditioned and to enable re-use of the carrier 350 for subsequent substrate transfer processes. Cleaning also removes a portion of the top surface 328 defined by the chucking region 324. Since no material of the carrier 350 is removed from the distance between the first electrode assembly 206 and bottom surface of the recessed pocket 302 remains constant, and as a result the electrostatic chucking capability of the carrier 350 may not be affected by the conditioning process.

In another embodiment, the recessed pocket 302 may be more shallow or non-existent in the chucking region 322. Alternatively, a protrusion, such as a continuous ring or plurality of discrete posts may circumscribe the first region to enable accurate positioning of the substrate 340 on the carrier 350. During a reconditioning process, the protrusion may be maintained while reconditioning the top surface 328. It is contemplated that the top surface 328 may be configured to provide enhanced adhesion qualities to prevent any deposited material from flaking off the top surface 328 and depositing on the substrate 340.

Figure 4A:
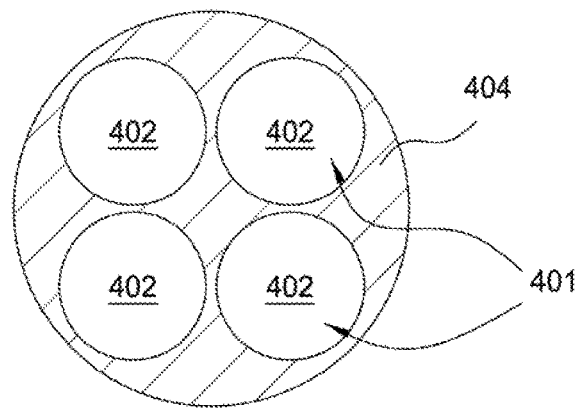
FIGS. 4A-4C illustrate plan views of various masks disposed over one or more substrates according to certain embodiment disclosed herein.
Figure 4B:
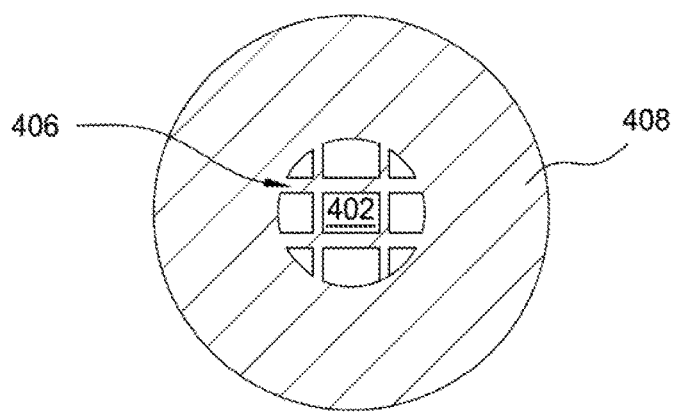
Figure 4C:
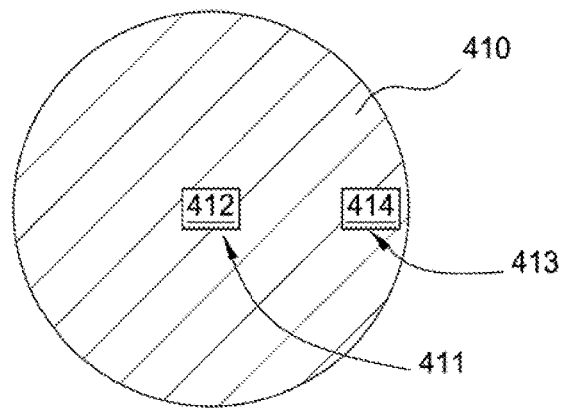

FIGS. 4A-4C illustrate plan views of various masks 404, 408, 410 disposed over one or more chucking regions 402, 412, 414. The masks and chucking regions illustrated in FIGS. 4A-4C are for illustrative purposes and it is contemplated that various mask and chucking region configurations are possible to accommodate the transfer and processing of substrates. The carrier 200 illustrated in FIGS. 2A-2B may be adapted to provide chucking regions 402 412, 414 by commensurate placement of the respective chucking electrode assemblies so that the masks 404, 408, 410 may be chucked as shown in FIGS. 4A-4C.

FIG. 4A illustrates a mask 404 disposed around a plurality of chucking regions 402. Four chucking regions 402 are illustrated in FIG. 4A. The mask 404 has a plurality of openings 401 formed therein which are sized to expose a respective one of the chucking regions 402. Substrates may be chucked to the chucking regions 402 and the mask 404 may be disposed over at least a portion of the substrates disposed on the regions 402 of the carrier. The openings 401 may be smaller than the substrates such that portions of the substrates are covered by the mask 404. In the example shown, the mask 404 may have a diameter of about 300 mm and the chucking regions 402 may be sized to accommodate sapphire substrates, wherein each substrate has a 4 inch diameter. It is contemplated that chucking regions of various sizes corresponding to substrates of any desired size or configuration may be incorporated in the embodiments described herein.

Substrates disposed on the chucking regions 402 and the mask 404 are electrostatically coupled to the carrier having at least two electrostatic chucking regions. For example, the chucking regions 402 may be configured to electrostatically chuck substrates by a first electrode assembly while the mask 404 may be disposed on a second region of the carrier directly under the mask 404 and be chucked by a second electrode assembly.

FIG. 4B illustrates a mask 408 disposed over a single chucking region 402. The mask 408 may be similar to the mask 404 of FIG. 4A, however a patterning portion 406 of the mask may extend over the chucking region 402 and enable patterning of a top surface of a substrate disposed on the chucking region 402. For example, the patterning portion 406 may be utilized in a photolithographic or deposition process to prevent development or deposition on various regions of the top surface of the substrate. The patterning portion 406 may be configured in any desirable arrangement and may extend over the chucking region 402 and across the top surface of the substrate. It is contemplated that multiple patterning portions may be formed in the mask 408 to accommodate processing of multiple substrates. Similar to FIG. 4A, chucking regions 402 may be configured to electrostatically chuck substrates by a first electrode assembly while the mask 408 may be disposed on a second region of the carrier under the mask 408 and be chucked by a second electrode assembly.

FIG. 4C illustrates a mask 410 disposed around a first chucking region 412 and a second chucking region 414. The mask 410 has a first opening 411 configured to expose the first chucking region 412 and a second opening 413 configured to expose the second chucking region 414. In one embodiment, the chucking regions 412, 414 are sized and configured to chuck dies cut from a larger substrate or pieces of a substrate. The first opening 411 is formed near the center of the mask 410 and the second opening 413 is formed near the edge of the mask 410. This configuration may be especially beneficial for process tuning and testing process center-to-edge uniformity across the surface of a substrate. However, the openings 411, 413 may be formed at any desirable location within the mask 410. Additionally, multiple other openings, such as three or more openings, four or more openings, five or more openings, six or more openings, etc. may be formed in the mask 410 for processing multiple substrate pieces. Accordingly, additional chucking regions may correspond to the additional openings of the mask 410.

Similar to FIGS. 4A-4B, the chucking regions 412, 414 may be configured to electrostatically chuck substrates using a first electrode assembly disposed directly below the chucking regions 412, 414 while the mask 410 may be disposed on a second chucking region of the carrier under the mask 410 and be chucked by a second electrode assembly residing directly below the second chucking region.

With regard to FIGS. 4A-4C, the chucking regions corresponding to and aligned with the first electrode assembly may be configured to accommodate a one or more substrates or substrate pieces as desired. The chucking regions may comprise substantially any shape to match the substrates disposed on the carrier. As such, the first electrode assembly may be formed in a manner which corresponds to the chucking regions which have substrates or substrate pieces disposed on the carrier. Similarly, the second region and corresponding second electrode assembly may be configured in any shape to accommodate chucking of the mask. The mask is configured to accommodate various substrate or substrate piece configurations such that substantially the entire top surface of the carrier is covered by the substrates and the mask.

Figure 5:
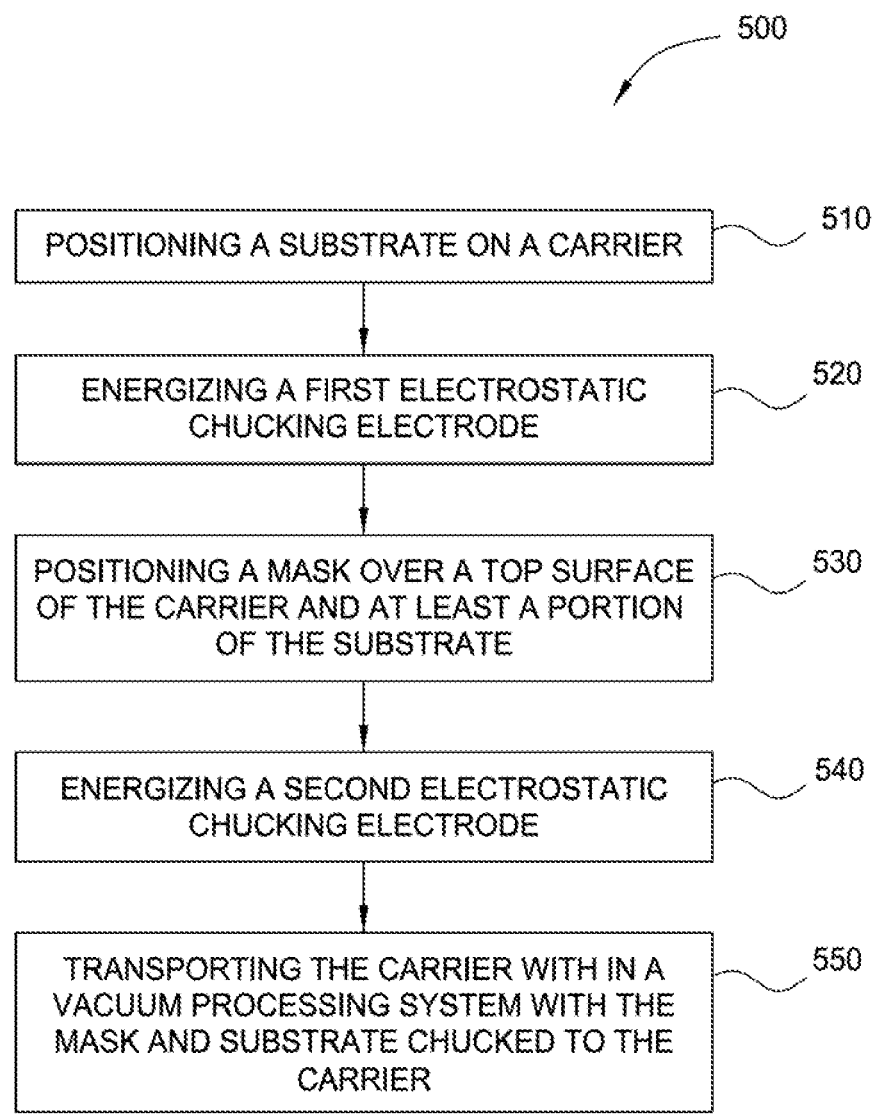
FIG. 5 illustrates operations for a method of transporting a substrate according to one embodiment disclosed herein.

FIG. 5 illustrates a method 500 for supporting a substrate. The method 500 begins at operation 510 by positioning a substrate on a carrier. The carrier may be substantially similar to the carriers described herein. As such, the carrier has a first electrostatic chucking electrode corresponding to a first chucking region of the carrier and a second electrostatic chucking electrode corresponding to a second chucking region of the carrier. A top surface of the carrier is configured to support a substrate and a mask which can be electrostatically chucked to the carrier. The substrate may be disposed on the first chucking region of the carrier.

At operation 520, the first electrostatic chucking electrode is energized. As a result, the substrate is electrostatically chucked to the first chucking region of the carrier. At operation 530, a mask is positioned over the top surface of the carrier exposing at least a portion of the substrate. Aperture(s) of the mask are configured to align with the chucking regions of the carrier on which the substrate is positioned. At operation 540, the second electrostatic chucking electrode is energized. As a result, the mask is electrostatically chucked to the second region of the carrier. At operation 550, the carrier, having the substrate and mask electrostatically chucked thereto, may then be transported by suitable substrate transfer apparatuses, such as a robot blade. In one embodiment, the carrier with the chucked substrate and mask may be transferred through a vacuum processing system, such as a cluster tool, for fabricating integrated circuits, such as into a processing chamber where various vacuum and/or plasma processes may be performed. Then, the carrier may be removed from the processing chamber and a dechucking power may be applied to the second electrostatic chucking electrode. The mask may then be removed from the carrier. Subsequently, a dechucking power may be applied to the first electrostatic chucking electrode and the substrate may then be removed from the carrier.

In summation, a carrier having one or more electrostatic chucking electrodes disposed therein is provided to enable the transfer of small substrates and substrate pieces. The carrier may have one or more regions corresponding to one or more electrostatic chucking electrodes configured to chuck one or more substrates or substrate pieces and a mask. At least of the one or more electrostatic chucking electrodes remains energized during processing in the processing chamber. Thus, the carrier enables secure support of a substrate and a mask and may provide for improved handling and transfer of substrates.

While the foregoing is directed to embodiments of the present invention, other and further embodiments of the invention may be devised without departing from the basic scope thereof, and the scope thereof is determined by the claims that follow.

The invention claimed is:

1. A substrate carrier apparatus, comprising:
a carrier body having a top surface;
a first electrode assembly comprising a first pair of interleaving electrodes disposed within the carrier body, the first electrode assembly corresponding to a first region of the top surface; and
a second electrode assembly comprising a second pair of interleaving electrodes disposed within the carrier body, the second electrode assembly disposed peripherally outward and circumscribing the first electrode assembly, wherein the second electrode assembly corresponds to a second region of the top surface and wherein the first region of the top surface is disposed below the second region of the top surface.

2. The apparatus of claim 1, wherein the carrier body is circular in shape.

3. The apparatus of claim 2, wherein the first region is circular in shape.

4. The apparatus of claim 3, wherein the second region is ring-shaped.

5. The apparatus of claim 4, wherein a discontinuity in the second region is sized to allow for passage of the first pair of interleaving electrodes from the first region to an edge of the carrier body.

6. The apparatus of claim 1, wherein the carrier body further comprises:
an insulating base; and
an encapsulating member.

7. The apparatus of claim 6, wherein the first electrode assembly and the second electrode assembly are disposed between the insulating base and the encapsulating member.

8. The apparatus of claim 1, wherein the second region of the top surface is disposed peripherally outward and circumscribes the first region of the top surface.

9. A substrate carrier apparatus, comprising:
an insulative base member;
an encapsulating member disposed on the insulative base member, the encapsulating member comprising a top surface;
a first electrode assembly comprising a first pair of interleaving electrodes disposed between the insulative base member and the encapsulating member, wherein the first electrode assembly defines a circular region corresponding to a first region of the top surface;
a second electrode assembly comprising a second pair of interleaving electrodes disposed between the insulative base member and the encapsulating member, wherein the second electrode assembly defines a ring-like region peripherally outward and circumscribing the circular region defined by the first electrode assembly, the ring-like region corresponding to a second region of the top surface, wherein the first region of the top surface and the second region of the top surface are disposed in different planes.

10. The apparatus of claim 9, wherein the encapsulating member and the first and second electrode assemblies are formed from one or more materials having substantially matching coefficients of thermal expansion.

11. The apparatus of claim 10, wherein the encapsulating member and the insulative base member are formed from one or more materials having substantially matching coefficients of thermal expansion.

12. The apparatus of claim 9, wherein the insulative base member and the encapsulating member are formed from a material or combination of materials selected from the group consisting of silicon oxide, silicon carbide, aluminum nitride, aluminum oxide, yttrium oxide yttrium aluminum garnet, titanium oxide, and titanium nitride.

13. The apparatus of claim 9, wherein the insulative base member and the encapsulating member are formed from a composite material of a ceramic and a metal.

14. An apparatus for supporting a substrate, comprising:
a carrier having a body and a top surface configured to support a substrate;
one or more electrostatic chucking electrodes disposed within the carrier body; and
a mask capable of being electrostatically coupled to the top surface of the carrier by application of power to the electrostatic chucking electrode, the mask configured to surround and expose one or more selected regions of the top surface of the carrier, wherein a first region of the top surface is disposed below a second region of the top surface, the second region of the top surface being disposed peripherally outward and circumscribing the first region.

15. The apparatus of claim 14, wherein a first electrostatic chucking electrode is disposed within the carrier below the first region of the top surface and circumscribed by the second region of the top surface.

16. The apparatus of claim 15, wherein a second electrostatic chucking electrode is disposed within the carrier, the second electrostatic chucking electrode corresponding to the second region of the top surface.

17. The apparatus of claim 16, wherein the substrate is disposed on the first region of the top surface and the mask is disposed on the second region of the top surface.

* * * * *